(12) United States Patent
Kang et al.

(10) Patent No.: US 8,415,882 B2
(45) Date of Patent: Apr. 9, 2013

(54) ORGANIC LIGHT EMITTING DIODE DISPLAY AND METHOD FOR MANUFACTURING THE SAME

(75) Inventors: Dong-Hun Kang, Yongin (KR); Min-Chul Suh, Yongin (KR); Dong-Won Han, Yongin (KR); Jin-Ho Kwack, Yongin (KR); Dae-Beom Shin, Yongin (KR); Hyo-Jin Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/049,795

(22) Filed: Mar. 16, 2011

(65) Prior Publication Data

US 2011/0291116 A1 Dec. 1, 2011

(30) Foreign Application Priority Data

May 28, 2010 (KR) .................. 10-2010-0050488

(51) Int. Cl.
*H05B 33/00* (2006.01)
(52) U.S. Cl.
USPC .................... 313/512; 313/504; 313/292
(58) Field of Classification Search ............ None
See application file for complete search history.

(56) References Cited

U.S. PATENT DOCUMENTS

| | | |
|---|---|---|
| 2008/0129194 A1 | 6/2008 | Abe et al. |
| 2008/0185960 A1* | 8/2008 | Koshiyama .......... 313/512 |
| 2009/0015148 A1 | 1/2009 | Hanari |
| 2009/0128457 A1 | 5/2009 | Nagayama |
| 2009/0161216 A1* | 6/2009 | Nam Goong et al. ........ 359/513 |
| 2012/0104945 A1* | 5/2012 | Adachi ................ 313/512 |

FOREIGN PATENT DOCUMENTS

| | | |
|---|---|---|
| JP | 2001-291580 A | 10/2001 |
| JP | 2003-257650 A | 9/2003 |
| JP | 2006-113568 A | 4/2006 |
| JP | 2009-193914 A | 8/2009 |
| KR | 10-2002-0076192 A | 10/2002 |
| KR | 10-2003-0074227 A | 9/2003 |
| KR | 10-2009-0073358 A | 7/2009 |

OTHER PUBLICATIONS

Extended European Search Report dated Dec. 5, 2011 for European Patent Application No. EP 11 159 340.6 which shares priority of Korean Patent Application No. KR 10-2010-0050488 with captioned U.S. Appl. No. 13/049,795.
Korean Office Action dated Nov. 28, 2011 for Korean Patent Application No. KR 10-2010-0050488 which corresponds to captioned U.S. Appl. No. 13/049,795.
European Examination Report dated Aug. 9, 2012 for European Application No. EP 11 159 340.6 which shares priority of Korean Patent Application No. KR 10-2010-0050488 with captioned U.S. Appl. No. 13/049,795.
Korean Notice of Allowance dated Jul. 18, 2012 for Korean Patent Application No. KR 10-2010-0050488 which corresponds with captioned U.S. Appl. No. 13/049,795.

* cited by examiner

*Primary Examiner* — Ashok Patel
(74) *Attorney, Agent, or Firm* — Knobbe, Martens, Olson & Bear LLP

(57) ABSTRACT

An organic light emitting diode (OLED) display is disclosed. In one embodiment, the display includes i) a substrate, ii) a driving circuit formed on the substrate, iii) an organic light emitting diode formed on the substrate and electrically connected to the driving circuit, iv) an encapsulation thin film formed on the driving circuit and organic light emitting diode and v) a spacer formed on the substrate and surrounding the encapsulation thin film.

11 Claims, 4 Drawing Sheets

ORGANIC LIGHT EMITTING DIODE DISPLAY AND METHOD FOR MANUFACTURING THE SAME

RELATED APPLICATIONS

This application claims priority to and the benefit of Korean Patent Application No. 10-2010-0050488 filed in the Korean Intellectual Property Office on May 28, 2010, the entire contents of which are incorporated herein by reference.

BACKGROUND

1. Field

The described technology generally relates to an organic light emitting diode (OLED) display, and more particularly, to an OLED display that has an encapsulation thin film and a manufacturing method thereof.

2. Description of the Related Technology

OLED displays are generally lightweight and have a thin profile. In addition, they are self-emissive and thus they do not require a separate light source. Furthermore, since the displays have characteristics of low power consumption, high luminance and high reaction speed, they have received much attention as the next generation display.

An OLED display includes a substrate on which an organic light emitting diode is formed. If moisture and oxygen penetrates into the organic light emitting diode that is made of an organic material, its performance degrades. Accordingly, an encapsulation method is generally used in order to prevent penetration of moisture and oxygen into OLED displays.

SUMMARY

One inventive aspect is an organic light emitting diode (OLED) display that suppresses performance degradation of an organic light emitting diode by internal penetration of moisture and oxygen.

Another aspect is a method for manufacturing an organic light emitting diode (OLED) display that suppresses the occurrence of particles.

Another aspect is an organic light emitting diode (OLED) display which includes: a substrate; a driving circuit and organic light emitting diode that is formed on the substrate; an encapsulation thin film that is formed on the driving circuit and organic light emitting diode; and a spacer that surrounds the encapsulation thin film on the substrate.

The height of the spacer may be higher than the height of the layered structure of the driving circuit and the organic light emitting diode.

The height of the spacer may be higher than the height of the layered structure of the driving circuit and the organic light emitting diode and the encapsulation thin film.

The height of the spacer may be 3 μm to 5 μm.

The spacer may include any one of acryl, urethane and polyimide (PI).

The spacer may be directly contacted with the encapsulation thin film along the circumference of the encapsulation thin film.

The encapsulation thin film may include at least a pair of inorganic film and organic film, and may be formed by alternately layering the inorganic film and the organic film.

Another aspect is a method for manufacturing an organic light emitting diode (OLED) display, which includes: preparing a substrate; forming a spacer on the substrate along an edge of the substrate; forming a driving circuit and organic light emitting diode on the substrate in an internal area that is partitioned by the spacer; and forming an encapsulation thin film so as to cover the driving circuit and the organic light emitting diode. The mask that is used in the forming of the driving circuit and the organic light emitting diode may be disposed on the spacer.

The height of the spacer may be higher than the height of the layered structure of the driving circuit and the organic light emitting diode.

The height of the spacer may be higher than the height of the layered structure of the driving circuit and the organic light emitting diode and the encapsulation thin film.

The height of the spacer may be 3 μm to 5 μm.

The spacer may be formed by including any one of acryl, urethane and polyimide (PI).

The encapsulation thin film may be contacted with the spacer in the internal area.

The encapsulation thin film may be formed by alternately layering at least a pair of inorganic film and organic film.

Another aspect is an organic light emitting diode (OLED) display, comprising: a substrate; a driving circuit formed on the substrate; an organic light emitting diode formed on the substrate and electrically connected to the driving circuit; an encapsulation thin film formed on the driving circuit and organic light emitting diode; and a spacer formed on the substrate and surrounding the encapsulation thin film.

In the above display, the height of the spacer is greater than the height of the layered structure of the driving circuit and the organic light emitting diode. In the above display, the height of the spacer is greater than the height of the layered structure of i) the driving circuit, ii) the organic light emitting diode and iii) the encapsulation thin film. In the above display, the height of the spacer is about 3 μm to about 5 μm.

In the above display, the spacer is formed at least partially of acryl, urethane and polyimide (PI). In the above display, the spacer directly contacts the encapsulation thin film along the circumference of the encapsulation thin film. In the above display, the encapsulation thin film includes at least a pair of an inorganic film and an organic film which are alternately formed.

Another aspect is a method of manufacturing an organic light emitting diode (OLED) display, comprising: preparing a substrate; forming a spacer on the substrate along an edge of the substrate; forming a driving circuit and an organic light emitting diode on the substrate to be surrounded by the spacer; and forming an encapsulation thin film so as to substantially cover the driving circuit and the organic light emitting diode, wherein the mask that is used in the forming of the driving circuit and the organic light emitting diode is supported by and contacts the spacer.

In the above method, the height of the spacer is greater than the height of the layered structure of the driving circuit and the organic light emitting diode. In the above method, the height of the spacer is greater than the height of the layered structure of i) the driving circuit, ii) the organic light emitting diode and iii) the encapsulation thin film. In the above method, the height of the spacer is about 3 μm to about 5 μm. In the above method, the spacer is formed at least partially of acryl, urethane and polyimide (PI).

In the above method, the encapsulation thin film contacts the spacer. In the above method, the encapsulation thin film is formed by alternately layering at least a pair of an inorganic film and an organic film. In the above method, the spacer substantially completely surrounds the encapsulation thin film in a selected plane:

Another aspect is an organic light emitting diode (OLED) display, comprising: a substrate; an organic light emitting diode formed on a surface of the substrate; an encapsulation layer covering the organic light emitting diode, wherein at least part of the encapsulation layer contacts the surface of the substrate; and a spacer formed on the surface of the substrate and surrounding the encapsulation layer.

In the above display, the spacer contacts the encapsulation layer: In the above display, the spacer substantially completely surrounds the encapsulation layer in a selected plane: In the above display, the spacer is greater in height than the encapsulation layer, and wherein the height is defined from the surface of the substrate. In the above display, the height of the spacer is about 3 μm to about 5 μm.

DETAILED DESCRIPTION

Figure 1:
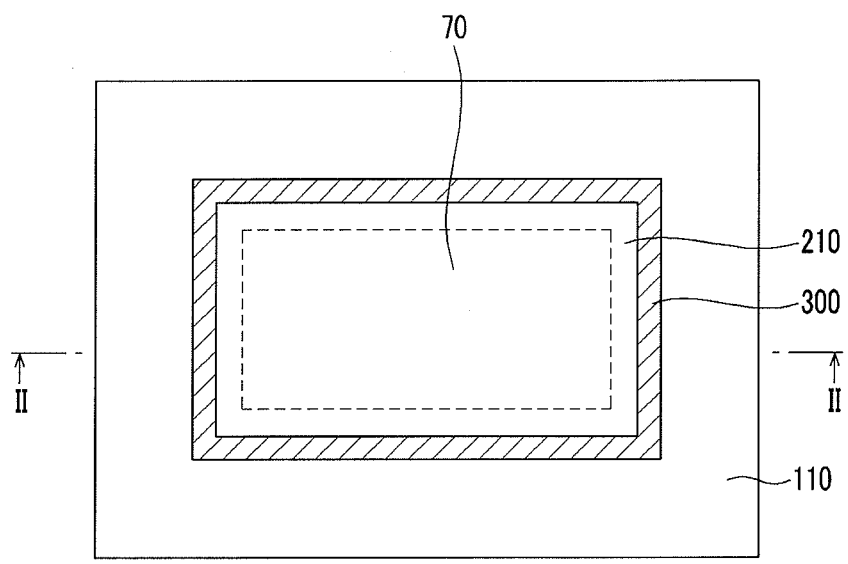
FIG. 1 is a top plan view of an organic light emitting diode (OLED) display according to an embodiment.

In general, the substrate for an OLED display is encapsulated by using metal or glass. However, if glass is used, there is a lower limit as to by how much the thickness of the entire display device can be reduced. In addition, flexible OLED displays are possible, and in view of the hardness of metal and glass, they are not suitable for such designs.

In manufacturing OLED displays, a mask is generally used to pattern OLED elements such as an organic light emitting diode and a driving circuit for supplying electrical signals to it. The mask may contact the substrate in the patterning process and particles may be introduced by the contact. The particles penetrate into the OLED display in conjunction with moisture and oxygen causing a deleterious effect to the organic light emitting diode, such that the life-span of the OLED display is reduced.

Hereinafter, embodiments will be described more fully hereinafter with reference to the accompanying drawings.

The drawings and description are to be regarded as illustrative in nature and not restrictive, and the size and thickness of each component shown in the drawings are arbitrarily shown for understanding and ease of description. In addition, it will be understood that when an element such as a layer, film is referred to as being "on" another element, it can be directly on the other element or intervening elements may also be present.

Figure 2:
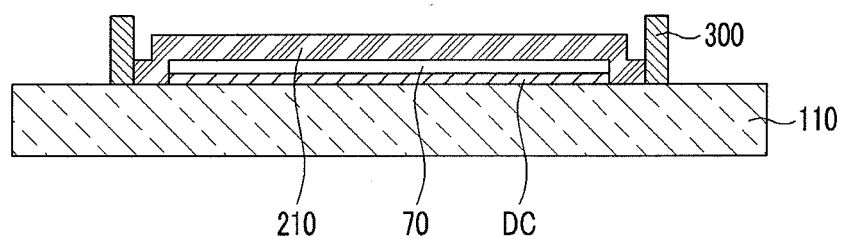
FIG. 2 is a cross-sectional view of an organic light emitting diode (OLED) display according to an embodiment, which is taken along the line II-II of FIG. 1.

Referring to FIGS. 1 and 2, an OLED display includes a display substrate 110, an encapsulation thin film 210 and spacer 300.

The display substrate 110 is configured to display an image, a driving circuit (DC) is formed on the display substrate 110, an organic light emitting diode 70 is formed on the driving circuit (DC), thus implementing the image through it. The organic light emitting diode 70 includes the organic emission layer that is made of an organic material, and is driven by a driving circuit (DC) that includes a thin film transistor and a capacitor, thus emitting light.

The encapsulation thin film 210 is formed on the organic light emitting diode 70, thus sealing the organic light emitting diode 70. The encapsulation thin film 210 is formed so that the organic film and the inorganic film are alternately layered on the organic light emitting diode 70 to cover the organic light emitting diode 70 and driving circuit (DC).

In one embodiment, the OLED display requires a low water vapor transmission rate (WVTR) in order to ensure a sufficient life-span. In one embodiment, by sealing the organic light emitting diode 70 using the encapsulation thin film 210, it suppresses the penetration of moisture and oxygen into the organic light emitting diode 70 and driving circuit (DC), thereby implementing the low water vapor transmission rate of about $10^{-6}$ g/m²/day or less.

In one embodiment, the spacer 300 surrounds the circumference of the encapsulation thin film 210 on the display substrate 110. The spacer 300 is configured to support the mask in order to form the driving circuit (DC) and organic light emitting diode 70, and will be described later.

In one embodiment, the plane shape of the spacer 300 is determined according to the plane shape of the organic light emitting diode 70 and the encapsulation thin film 210. In one embodiment, since the plane shape of the organic light emitting diode 70 and the encapsulation thin film 210 is a substantially rectangular shape, the spacer 300 that surrounds the encapsulation thin film 210 has a substantially rectangular band plane shape. In one embodiment, the encapsulation thin film 210 contacts the spacer 300. That is, the encapsulation thin film 210 contacts the spacer 300, and is formed in substantially the entire area on the display substrate 110 that is partitioned by the spacer 300.

In one embodiment, the height of the spacer 300 is greater than the height of the layered structure of the driving circuit (DC) and the organic light emitting diode 70. The height of the spacer 300 may be greater than the height of the layered structure of driving circuit (DC), organic light emitting diode 70 and encapsulation thin film 210. The height of the spacer may be about 3 μm to about 5 μm, but in the case of when the height of the encapsulation thin film 210 is lower than about 3 μm, the height of the spacer may be lower than about 3 μm.

The spacer 300 may be formed of the same material as the pixel definition film that will be described later. For example, the spacer 300 may be formed of an organic material such as acryl, urethane, and polyimide (PI). As described above, in the case of when the spacer 300 is formed of the same material as the pixel definition film, while the pixel definition film is formed, the spacer 300 is formed at the same time, such that a whole process may be simplified. However, the material of the above spacer is illustrated, various modifications may be possible by those who are skilled in the art.

As described above, it is possible to more efficiently suppress the penetration of moisture and oxygen into by forming the spacer 300 that surrounds the circumference of the encapsulation thin film 210. In addition, in the manufacturing process, it is possible to lower the occurrence of defects and prolong a life-span of the OLED display by suppressing the occurrence of particles, and this will be described later.

Figure 3:
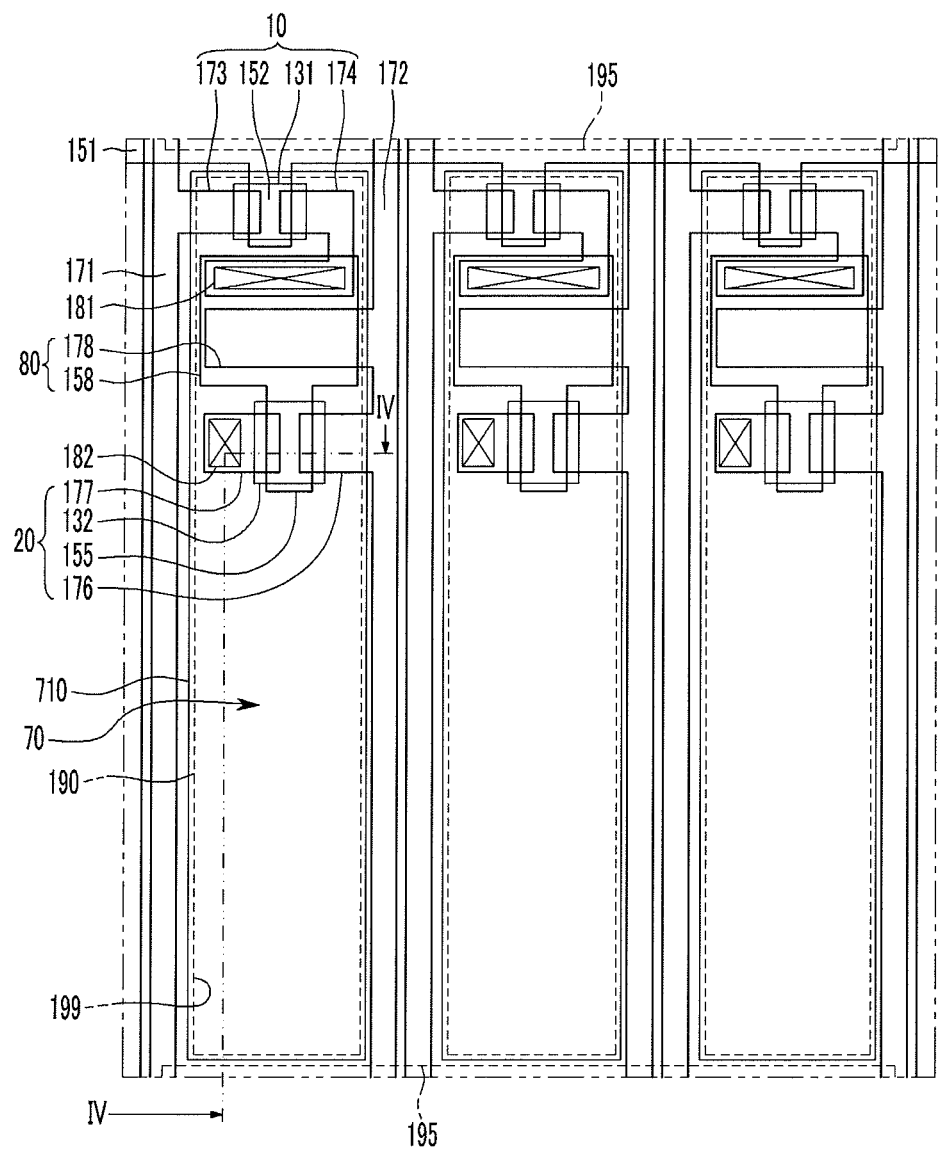
FIG. 3 is a plan layout view of a pixel of an organic light emitting diode (OLED) display according to an embodiment.
Figure 4:
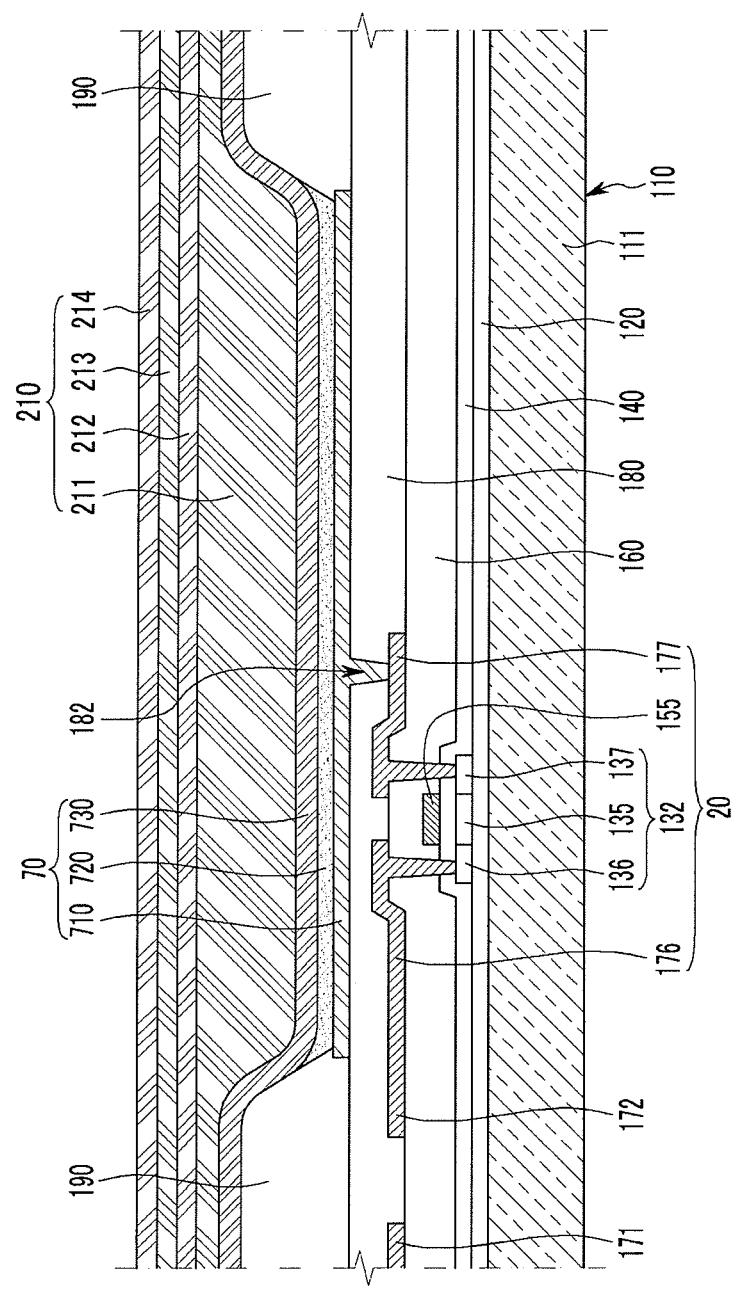
FIG. 4 is a cross-sectional view of a pixel of an organic light emitting diode (OLED) display according to an embodiment, which is taken along the line IV-IV of FIG. 3.

Referring to FIG. 3 and FIG. 4, an active matrix (AM) type organic light emitting diode (OLED) display that has a 2Tr-1 Cap structure which includes two thin film transistors (TFT), and one capacitor for one pixel is shown, but is not considered limiting. For example, the OLED display may be provided with three or more thin film transistors and two or more capacitors for one pixel, and a disposition of the wire may be changed to provide various structures. Here, the pixel means a minimum unit that displays an image, and the OLED display displays an image through a plurality of pixels.

The display substrate 110 includes a switching thin film transistor 10, a driving thin film transistor 20, a capacitor 80 and an organic light emitting diode (OLED) 70 for each one pixel. In addition, the display substrate 110 further includes a gate line 151 that is disposed along a predetermined direction, and a data line 171 and a common electric power line 172 that insulately cross the gate line 151.

The organic light emitting diode 70 includes the first electrode 710, the organic emission layer 720 that is formed on the first electrode 710, and the second electrode 730 that is formed on the first organic emission layer 720. In one embodiment, the pixel electrode 710 is an anode that is a hole injection electrode and the common electrode 730 is a cathode that is an electron injection electrode. The holes and electrons are injected from the pixel electrode 710 and common electrode 730 to the organic emission layer 720, and when the exciton that is combined with the injected hole and electron falls from the exited state to the bottom state, light emission is implemented.

The capacitor 80 includes the first capacitor plate 158 and the second capacitor plate 178 that are disposed between gate insulating layers 140 that act as a dielectric material. The capacitor capacitance is determined by the charge that is accumulated in the capacitor 80 and the voltage between both capacitor plates 158 and 178.

The switching thin film transistor 10 includes a switching semiconductor layer 131, switching gate electrode 152, a switching source electrode 173 and a switching drain electrode 174. The driving thin film transistor 20 includes a driving semiconductor layer 132, a driving gate electrode 155, a driving source electrode 176 and a driving drain electrode 177. The switching thin film transistor 10 is a switching element that selects the pixel that emits light. The switching gate electrode 152 is electrically connected to the gate line 151, the switching source electrode 173 is electrically connected to the data line 171, and the switching drain electrode 174 is separated from the switching source electrode 173 and connected to the first capacitor plate 158.

The driving thin film transistor 20 applies a driving power for emitting light of the organic emission layer 720 of the organic light emitting diode 70 to the pixel electrode 710 in the selected pixel. The driving gate electrode 155 is electrically connected to the first capacitor plate 158, the source electrode 176 and the second capacitor plate 178 are electrically connected to the common power line 172, and the driving drain electrode 177 is electrically connected to the pixel electrode 710 of the organic light emitting diode 70 through a contact hole 182.

By the above structure, the switching thin film transistor 10 is operated by the gate voltage that is applied to the gate line 151 and transfers the data voltage that is applied to the data line 171 to the driving thin film transistor 20. The voltage that corresponds to a difference in the common voltage that is applied from the common power line 172 to the driving thin film transistor 20 and the data voltage that is transferred from the switching thin film transistor 10 is stored in the capacitor 80. Further, the current that corresponds to the voltage that is stored in the capacitor 80 flows through the driving thin film transistor 20 to the organic light emitting diode 70 to allow the organic light emitting diode 70 to emit light.

Referring to FIG. 4, a method of manufacturing an OLED display according to one embodiment will be described.

In one embodiment, the substrate member 111 of the display substrate 110 is formed of an insulating substrate such as glass and the like, and the buffer layer 120 is formed on the first substrate member 111. The buffer layer 120 may be formed of silicon nitride (SiNx), silicon oxide (SiOx), silicon nitroxide (SiOxNy) and the like, and the buffer layer 120 may be omitted according to the kind of substrate member 111 and the process condition. The driving semiconductor layer 132 is formed on the buffer layer 120. The driving semiconductor layer 132 includes a channel region 135 in which an impurity is not doped, and a source region 136 and a drain region 137 that are p+ doped to both ends of the channel region 135. In one embodiment, the doped ion material is a P type impurity such as boron (B).

In one embodiment, a thin film transistor that has a PMOS structure that uses the P type impurity as the driving thin film transistor 20 is used. Alternatively, a thin film transistor that has an NMOS structure or CMOS structure may be used. In addition, in one embodiment, the driving thin film transistor 20 is a polycrystalline thin film transistor that includes a polysilicon film, but the switching thin film transistor 10 not shown in FIG. 4 may be a polycrystalline thin film transistor or amorphous thin film transistor that includes an amorphous silicon film.

In one embodiment, the gate insulating layer 140 that is formed at least partially of silicon nitride or silicon oxide is formed on the driving semiconductor layer 132. The gate wire that includes the gate electrode 155 is formed on the gate insulating layer 140, and the gate wire further includes the gate line 151, the first capacitor plate 158 and the other wires. In addition, the driving gate electrode 155 is formed so as to overlap with at least a portion of the driving semiconductor layer 132, particularly the channel region 135. On the gate insulating layer 140, the interlayer insulating layer 160 that covers the driving gate electrode 155 is formed. The gate insulating layer 140 and the interlayer insulating layer 160 have holes that expose the source region 136 and drain region 137 of the driving semiconductor layer 132. In one embodiment, the interlayer insulating layer 160 is formed at least partially of silicon nitride, silicon oxide and the like likewise the gate insulating layer 140. The data wire that includes the driving source electrode 176 and driving drain electrode 177 is formed on the interlayer insulating layer 160, and the data wire further includes the data line 171, the common power line 172, the second capacitor plate 178 and the other wires. In addition, the driving source electrode 176 and driving drain electrode 177 are electrically connected to the source region 136 and drain region 137 of the driving semiconductor layer 132 through the holes that are formed on the interlayer insulating layer 160 and gate insulating layer 140.

As described above, the driving semiconductor layer 132, driving gate electrode 155, driving source electrode 176 and driving drain electrode 177 are formed, and the configuration of the driving thin film transistor 20 is not limited to the above examples but may be variously modified by those who are skilled in the art.

A planarization layer 180 that covers a data wire is formed on the interlayer insulating layer 160, and the contact hole 182 that exposes a portion of the drain electrode 177 is formed on the planarization layer 180. Meanwhile, any one of the interlayer insulating layer 160 and planarization layer 180 may be omitted.

The pixel electrode 710 of the organic light emitting diode 70 is formed on the planarization layer 180, and the pixel electrode 710 is electrically connected through the contact hole 182 to the drain electrode 177. In addition, a pixel definition film 190 that has a plurality of openings 199 that expose each pixel electrode 710 is formed on the planarization layer 180. The portion on which the pixel definition film 190 is formed substantially becomes a non-light emitting area and the portion on which the opening 199 of the pixel definition film 190 is formed substantially becomes a light emitting area. The organic emission layer 720 is formed on the pixel electrode 710, and the common electrode 730 is formed on the organic emission layer 720, thereby constituting the organic light emitting diode 70. The organic emission layer 720 is formed of a low molecular organic material or high molecular organic material, and the organic emission layer 720 may be formed of a multilayer that includes one or more of a hole injection layer (HIL), hole transport layer (HTL), electron transport layer (ETL) and electron injection layer (EIL).

An encapsulation thin film 210 for sealing the organic light emitting diode 70 is formed on the common electrode 730. The encapsulation thin film 210 includes one pair or more of organic films 211 and 213 and inorganic films 212 and 214, and is formed by alternately layering the organic films 211 and 213 and inorganic films 212 and 214. In one embodiment, the encapsulation thin film 210 includes two pairs of organic films 211 and 213 and inorganic films 212 and 214, but it is not limited thereto.

As described above, the encapsulation thin film 210 that is obtained by alternately layering the organic films 211 and 213 and the inorganic films 212 and 214 is formed on the organic light emitting diode 70, such that the contacting of moisture or oxygen to the organic light emitting diode 70 is suppressed to prevent performance degradation.

Meanwhile, the switching thin film transistor 10, the driving thin film transistor 20, the capacitor 80 and the organic light emitting diode 70 are patterned by using the mask. In this patterning process, the mask contacts the display substrate 110 to generate particles. The particles penetrate into the OLED display to deteriorate the performance of the organic light emitting diode, and may be a cause of the occurrence of defects of the OLED display and life-span deterioration thereof. Accordingly, in one embodiment, as described above, the occurrence of defects of the OLED display and the life-span deterioration thereof are suppressed by forming the spacer 300 on the display substrate 110.

Figure 5:
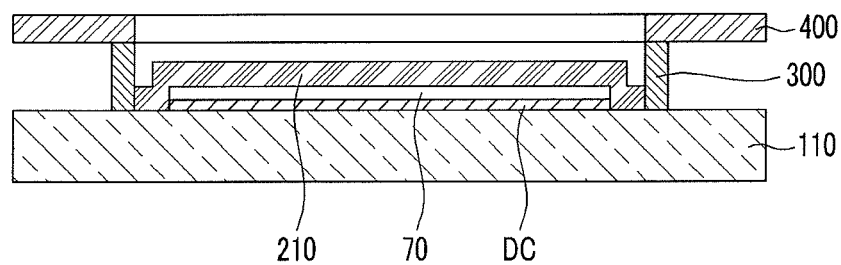
FIG. 5 is a view that illustrates a contact of an organic light emitting diode (OLED) display and a mask according to an embodiment.

FIG. 5 is a view that illustrates a contact of an OLED display and a mask according to an embodiment, and a manufacturing method of the OLED display will be described with reference to it.

In one embodiment, the OLED display is manufactured by preparing a display substrate 110, forming a spacer 300 along an edge of the display substrate 110, forming a driving circuit (DC) and organic light emitting diode 70, and forming an encapsulation thin film 210 to cover the driving circuit (DC) and organic light emitting diode 70. As shown in FIG. 5, the driving circuit (DC) and organic light emitting diode 70 are formed in an internal area of the areas that are partitioned by the spacer 300 on the display substrate 110, and are formed through deposition and patterning processes using the mask 400.

As described above, if the mask 400 contacts the display substrate 110, the particles are generated and moisture and oxygen may easily penetrate into the OLED device, as a result, the performance of the OLED display may be deteriorated and defects may be generated. However, according to one embodiment, the spacer 300 is formed on the display substrate 110, the mask 400 is disposed to be supported on the spacer 300, thereby suppressing the above problems.

In one embodiment, since the driving circuit (DC) and organic light emitting diode 70 are formed by using the mask 400, the height of the spacer 300 that supports the mask 400 is greater than the height of the layered structure of the driving circuit (DC) and organic light emitting diode 70.

In addition, the height of the spacer 300 may be greater than the height of the layered structure of the driving circuit (DC), organic light emitting diode 70 and encapsulation thin film 210. In the area that is partitioned by the spacer 300, the encapsulation thin film 210 is layered to cover the driving circuit (DC) and organic light emitting diode 70. If the height of the spacer 300 is greater than the height of the layered structure of the driving circuit (DC), organic light emitting diode 70 and encapsulation thin film 210, in the area that is partitioned by the spacer 300, the process for layering the encapsulation thin film 210 may be easily performed.

In one embodiment, the encapsulation thin film 210 is formed by alternately layering at least a pair of inorganic film and organic film. In addition, since the encapsulation thin film 210 is layered in the area that is partitioned by the spacer 300 on the organic light emitting diode 70, it may directly contact the spacer 300. By this process, the organic light emitting diode 70 may be sealed by the encapsulation thin film 210 and an external boundary may be formed by the spacer 300. Accordingly, it is possible to easily suppress the penetration of moisture and oxygen into the OLED display and to suppress the occurrence of particles in the process.

According to at least one of the disclosed embodiments, it is possible to prevent performance degradation of an organic light emitting diode (OLED) display by suppressing penetration of moisture and oxygen into the display.

In addition, in the process of manufacturing the OLED display, it is possible to suppress the occurrence of defects of the display and prolong life-span.

While this disclosure has been described in connection with certain embodiments, it is to be understood that the disclosed embodiments are not limiting. Thus, the appended claims are intended to cover various modifications and equivalent arrangements.

What is claimed is:

1. An organic light emitting diode (OLED) display, comprising:
    a substrate;
    a driving circuit formed on the substrate;
    an organic light emitting diode formed on the substrate and electrically connected to the driving circuit;
    an encapsulation thin film formed on the driving circuit and organic light emitting diode; and
    a spacer formed on the substrate and surrounding the encapsulation thin film, wherein the encapsulation thin film comprises a side surface facing the spacer, and wherein only part of the side surface of the encapsulation thin film contacts the spacer.

2. The display of claim 1, wherein the height of the spacer is greater than the height of the layered structure of the driving circuit and the organic light emitting diode.

3. The display of claim 2, wherein the height of the spacer is greater than the height of the layered structure of i) the driving circuit, ii) the organic light emitting diode and iii) the encapsulation thin film.

4. The display of claim 3, wherein the height of the spacer is about 3 to about 5 μm.

5. The display of claim 1, wherein the spacer is formed at least partially of acryl, urethane and polyimide (PI).

6. The display of claim 1, wherein the encapsulation thin film includes at least a pair of an inorganic film and an organic film which are alternately formed.

7. An organic light emitting diode (OLED) display, comprising:
    a substrate;
    an organic light emitting diode formed on a surface of the substrate;

an encapsulation layer covering the organic light emitting diode, wherein at least part of the encapsulation layer contacts the surface of the substrate; and a spacer formed on the surface of the substrate and surrounding the encapsulation layer, wherein the encapsulation layer comprises a side surface facing the spacer, and wherein only part of the side surface of the encapsulation layer contacts the spacer.

8. The display of claim 7, wherein the spacer contacts the encapsulation layer.

9. The display of claim 7, wherein the spacer substantially completely surrounds the encapsulation layer in a selected plane.

10. The display of claim 7, wherein the spacer is greater in height than the encapsulation layer, and wherein the height is defined from the surface of the substrate.

11. The display of claim 7, wherein the height of the spacer is about 3 μm to about 5 μm.

\* \* \* \* \*